United States Patent

Fujisaki

[11] Patent Number: 5,856,985
[45] Date of Patent: Jan. 5, 1999

[54] TEST PATTERN GENERATOR

[75] Inventor: Kenichi Fujisaki, Gyoda, Japan

[73] Assignee: Advantest Corp., Tokyo, Japan

[21] Appl. No.: 849,682

[22] PCT Filed: Dec. 1, 1996

[86] PCT No.: PCT/JP96/00035

§ 371 Date: Sep. 8, 1997

§ 102(e) Date: Sep. 8, 1997

[87] PCT Pub. No.: WO97/25717

PCT Pub. Date: Jul. 17, 1997

[51] Int. Cl.[6] .................................................. G01R 31/28
[52] U.S. Cl. ...................... 371/27.1; 371/27.5; 371/27.6; 371/21.1
[58] Field of Search ................................. 371/27.1, 27.5, 371/27.6, 21.1, 21.3

[56] References Cited

U.S. PATENT DOCUMENTS

| | | | |
|---|---|---|---|
| 4,369,511 | 1/1983 | Kimura et al. | 371/21.2 |
| 4,370,746 | 1/1983 | Jones et al. | 371/27.6 |
| 4,958,345 | 9/1990 | Fujisaki | 371/21.3 |
| 5,453,995 | 9/1995 | Behrens | 371/27.6 |

FOREIGN PATENT DOCUMENTS

| | | |
|---|---|---|
| 5-234399 | 9/1993 | Japan . |
| 7-220499 | 8/1995 | Japan . |

*Primary Examiner*—Hoa T. Nguyen
*Attorney, Agent, or Firm*—Muramatsu & Associates

[57] ABSTRACT

A test pattern generator is provided that can perform a block write function testing at high speed. To achieve this aim, a data register 41 is provided which takes in data signal from a data generator 13 by a first write signal from a control signal generator 15. An address selector 44 is provided which takes in specific bits from an address generated by an address generator 12. A mask data register file 42 is provided which takes the data signal in an area specified by a second write signal from a control signal generator 15. A write data register file 43 is provided which takes the data signal in an area specified by a third write signal from the control signal generator 15. A data formatter 60 is provided that synthesizes and outputs either an output data of the data register 41 or an output data of the data generator 13 based on the above signals. Those components described above comprise the test pattern generator.

2 Claims, 7 Drawing Sheets

Select Logic

Data Multiplexer

FIG. 6

|  | D0 | D1 | D2 | D3 |
|---|---|---|---|---|
| C0 | C0D0 | C0D1 | C0D2 | C0D3 |
| C1 | C1D0 | C1D1 | C1D2 | C1D3 |
| C2 | C2D0 | C2D1 | C2D2 | C2D3 |
| C3 | C3D0 | C3D1 | C3D2 | C3D3 |

Memory Cell

FIG. 7

|  | D0 | D1 | D2 | D3 |
|---|---|---|---|---|
| C0 | RD0 | ID1 | RD2 | RD3 |
| C1 | ID0 | ID1 | ID2 | ID3 |
| C2 | RD0 | ID1 | RD2 | RD3 |
| C3 | ID0 | ID1 | ID2 | ID3 |

Expected Value

MUT

Block Write Function

TEST PATTERN GENERATOR

TECHNICAL FIELD

This invention relates to a test pattern generator for testing semiconductor memories, and more particularly, to a test pattern generator for testing semiconductor memories having a block write function.

BACKGROUND ART

FIG. 8 shows an example of structure of a conventional semiconductor test system for testing semiconductor devices. The example of FIG. 8 is directed to a situation where the device under test is a semiconductor memory. An address signal is provided to a memory device 2 under test (MUT) from an address generator 12, and a data signal is provided to the memory under test from a data generator 13. A clock control signal which specifies read or write operation is also provided to the memory device from a clock control signal generator 14. After a write operation is completed by applying these signals to the memory device 2 under test, in a read operation, the data read out from the memory device is applied to a logic comparator 3. At the same time, expected value data is provided to the logic comparator 3 from a pattern generator 1. Each of the generators note above is controlled by a sequence controller 11. The pattern generator 1 is comprised of the above mentioned generators and controllers. Furthermore, if necessary, an expected value generator 4 which includes a buffer memory may be provided in the pattern generator to generate expected value data.

In recent years, various types of memory devices to be tested (hereinafter referred to "MUT") have been introduced in the market. For example, there is a type of memory device which has a block write function. Thus, there is a need to test these memory devices which perform complex functions at high speed.

The block write function within the context of the invention is a function to write the data in a block of memory cells, i.e., to write data in a n-bit data register for m words (m×n block write) of the MUT by one write cycle. The word number m in the memory to write the data therein is specified by several lower bits of the column address data. For instance, when the lower two bits are used, four words will be specified. Data supplied to a data pin of the MUT in the block write operation is used as word mask data. The data in a mask register in the MUT is used as bit mask data. The data bit or word in the MUT which is not replaced with new data can be independently specified by the mask data.

FIG. 9 is a schematic diagram showing the block of memory cells in the MUT to be accessed by one block write (4×4 block write in this example) operation. The block to be accessed by one block write operation is defined by C0, C1, C2, C3, which are designated by decoding the lower two bits of the column address with respect to a corresponding set of plural data bits D0, D1, D2, D3.

FIG. 10 is an example of operation in which it is shown the relationship between each of the data in the sixteen (16) memory cells accessed by the 4×4 block write operation. Mask data bits (MD0, MD1, MD2, MD3) are shown in the drawing corresponding to the sixteen (4×4=16) memory cells. Data bits (BD0, BD1, BD2, BD3) that are applied to data pins of the MUT are shown in FIG. 10. Further, data register bits (RD0, RD1, RD2, RD3) to be used as write data in the block write operation are shown in FIG. 10. In this example, logic "0" in the mask data is to prevent renewal of the data. Thus, the data in the memory cells shown by slanting lines are prohibited from being written the new data therein, i.e., the data renewal will not take place for the specified memory cells. When reading the data which has been stored through the block write operation, such data is read out word by word like an ordinary reading process of a memory.

In order to test such memory devices having the block write function as described above, expected value data for the test must be generated with regard to the mask data in the word direction and the bit direction. Since the mask operation and the combination of the mask data are complex, the generation of the expected value data to evaluate the function is consequently complex and difficult.

As a way of testing the MUT having the block write function, in the conventional technology, a method is used wherein an expected value generator which emulates the block write functions to generate the expected value data is comprised of a buffer memory. In such a case, the buffer memory has a memory capacity which is equivalent to the MUT and is so arranged to have the block write function of the MUT. When the MUT performs the block write function during the test, the same function is also carried out in the buffer memory. When the data written in the MUT is read out to evaluate the same, the data in the buffer memory is read out at the same time, which is used as the expected value for testing the data from the MUT.

However, because the operating speeds of memory devices are rapidly increasing these days, a larger and more expensive system is unavoidable to install a high speed buffer memory that enables the function equivalent to the MUT performing this high-speed operation. This is because a high-speed memory is expensive even though its memory capacity is small. When buffer memories slower than the speed of the MUT are used, an interleave method must be employed. However, the interleave method requires overall memory capacity which is several times larger than that of the MUT, hence the system results in large and expensive.

Therefore, it is an object of the present invention to resolve these problems and to provide a test pattern generator with low cost which is capable of testing the block write function of the high speed MUT.

DISCLOSURE OF THE INVENTION

In the present invention, in the test pattern generator 1 which generates expected data for performing the logical comparison with the output of the a device 2 under test, a data register 41 is provided which takes in a data signal from a data generator 13 based on a first write command signal from a control signal generator 15. An address selector 44 is provided for taking out specified bits of an address signal generated by an address generator 12. A mask data register file 42 is provided for taking the data signal from the data generator 13 into an area predetermined by a data select signal output from the address selector 44 by a second write command signal from the control signal generator 15. A write data register file 43 is provided for taking the data signal from the data generator 13 into an area predetermined by a data select signal output from the address selector 44 by a third write command signal from the control signal generator 15. Further, a data formatter 60 is provided which combines and outputs either the data output from the data register 41 or the data output from the data generator 13 on the basis of the output signal of the address selector 44, the output signal of the mask data register file 42 and the output signal of the write data register file 43.

The test pattern generator of the present invention is comprised of the above noted elements.

In the test pattern generator above, it is also possible to form the test pattern generator by including a multiplexer 50 which selects and outputs either the output signal of the data formatter 60 or the output signal of the data generator 13 based on the select signal from the control signal generator 15.

According to the present invention, when reading the data in the memory area of the MUT in which the block write operation is performed, the multiplexer 50 is set to select the expected value data from an expected value combining part 40 as shown in FIG. 1. In this situation, the evaluation of the memory device is carried out by comparing the read out data from the MUT and the expected value data by a logic comparator 3 in a manner similar to test an ordinary memory. This read operation is performed by generating the same data pattern from the pattern generator 13 which has been used for initializing the memory area prior to the block write test. This data pattern generated in the second time is used for producing the expected value data as data that has been masked and not been renewed. In other words, the expected value data which will not contradict to the condition of the memory cells of the MUT after the block write operation is generated while alternately switching between RDn data and Idn data for each one bit by the mask data from the mask data register file 42 and the write data register file 43, respectively, by the data formatter 60 in the expected value combining part.

BRIEF DESCRIPTION OF THE DRAWINGS

FIG. 6 shows an example of a block of memory cells in a 4×4 block write operation.

FIG. 7 shows expected value data for the block write operation.

BEST MODE FOR CARRYING OUT THE INVENTION

The embodiment of the present invention is explained with reference to the drawings.

Figure 1:
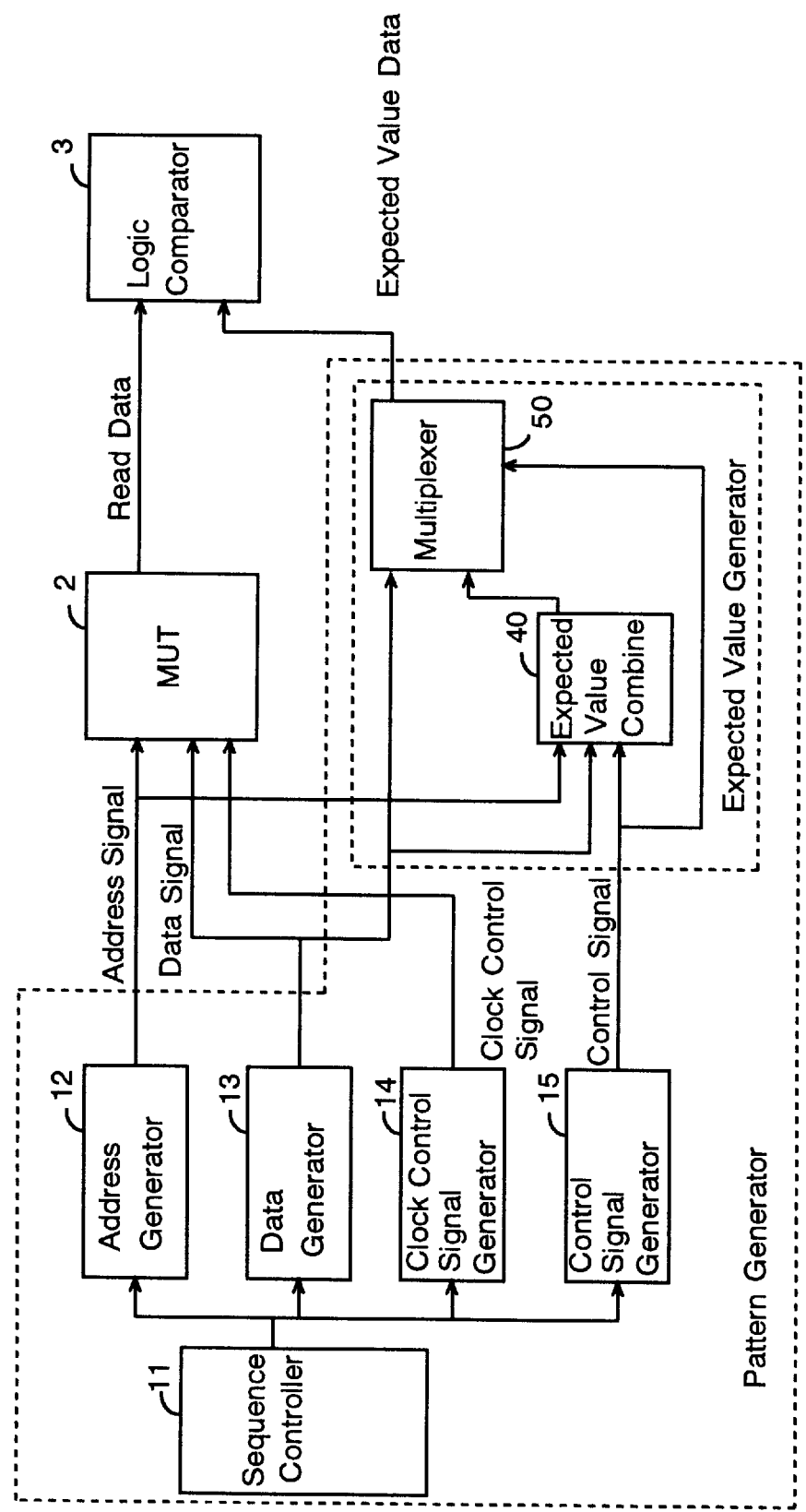
FIG. 1 is a block diagram of a semiconductor memory test system including an embodiment of a test pattern generator of the present invention.
Figure 2:
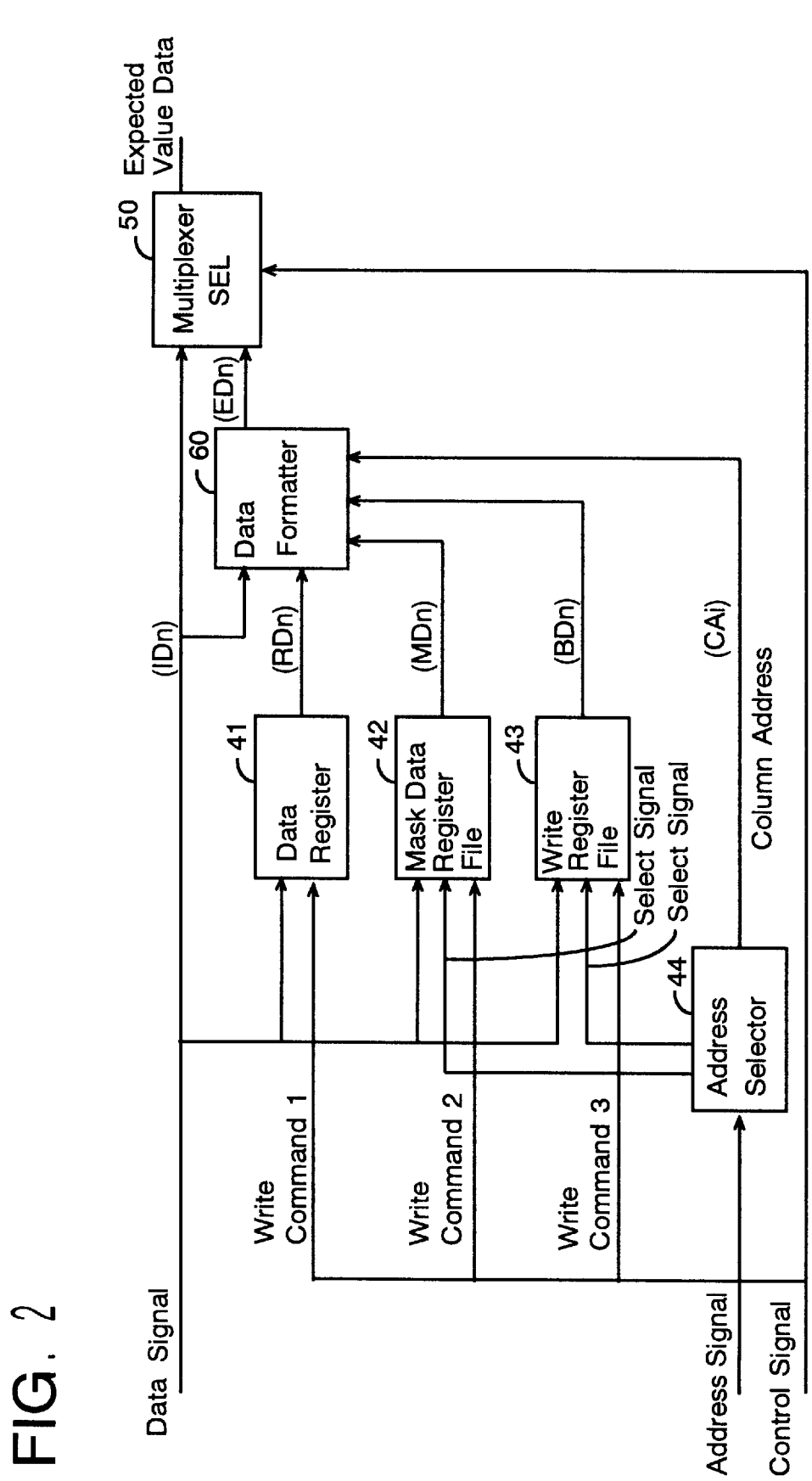
FIG. 2 is a block diagram showing an expected value data generator of the present invention.
Figure 3:
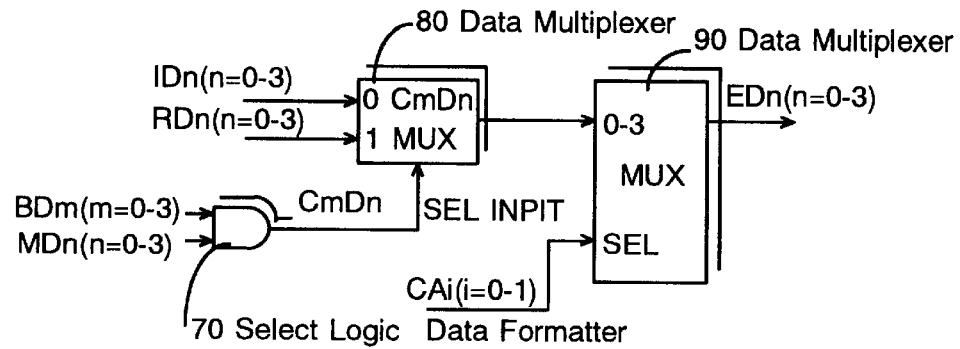
FIG. 3 shows an example of structure of a 4×4 data formatter 60 of the present invention.

FIG. 1 is a block diagram of a semiconductor memory test system having an embodiment of a test pattern generator of the present invention. FIG. 2 is a block diagram showing an expected value data generator in the test pattern generator of the present invention. FIG. 3 shows an example of structure of a 4×4 data formatter provided in the expected value data generator of the present invention.

As shown in FIG. 1, the expected value data which corresponds to the block write function is generated by an expected value combining part 40 as described in detail below. A multiplexer 50 selects either an output of the expected value combining part 40 for the block write function or expected value data from a data generator 13 for the conventional function based on a control signal from a control signal generator 15. The selected output from the multiplexer 50 is applied to a logic comparator 3.

FIG. 2 is a block diagram showing the expected value generator of the present invention. As shown in FIG. 2, a data register 41 functions to take in the data signal from the data generator 13 based on a write command signal 1 from the control signal generator 15. The output of this data register 41 is provided to a data formatter 60 as a data register bit signal RDn for producing the expected value data for the block write operation corresponding to the memory area shown in FIGS. 7 and 10.

An address selector 44 takes bits of column address in the MUT address generated by the address generator 12 for the block write operation. The output of the address selector 44 is provided to the data formatter 60 as a column address signal (CAi). In addition, the address selector 44 takes out each data select signal such as mask data (MDn) and write data (BDn) in the MUT address.

A mask data register file 42 functions to take in the data signal from the data generator 13 based on a write command signal 2 from the control signal generator 15 and stores the data signal in the area defined by the data select signal from the address selector 44. The output of the mask data register file 42 is provided to the data formatter 60 as a mask data bit signal MDn shown in FIG. 10.

Figure 10:
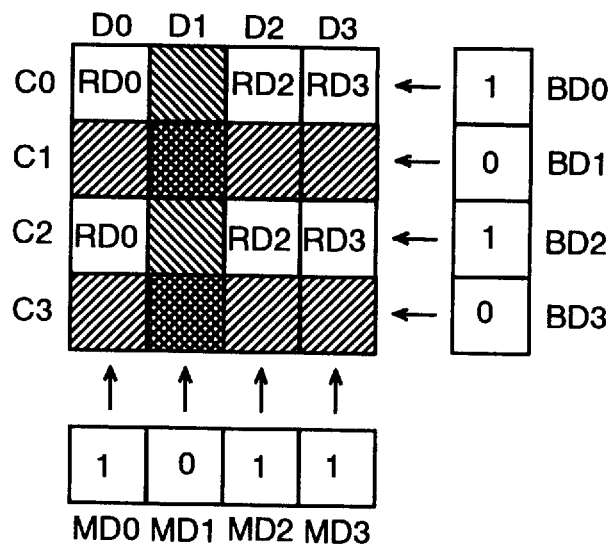
FIG. 10 is an example of operation which shows the relationship between each of the data in the sixteen (16) memory cells accessed by the 4×4 block write operation.

A write data register file 43 takes in the data signal from the data generator 13 based on a write command signal 3 from the control generator 15 and stores the data signal in the area defined by the data select signal from the address selector 44. The output of the write data register file 43 is provided to the data formatter 60 as a data bit signal BDn to be applied to the data pins of the MUT in the block write operation as shown in FIG. 10.

The data formatter 60 synthesizes expected value data in response to the block write function of the MUT based on the input data signal (Idn), the data register bit signal (RDn) the mask data bit signal (MDn), the data bit signal (BDn) applied to the data pins of the MUT in the block write operation of the MUT, and the column address. The output of the data formatter 60 is the expected value data (Edn).

Figure 4:
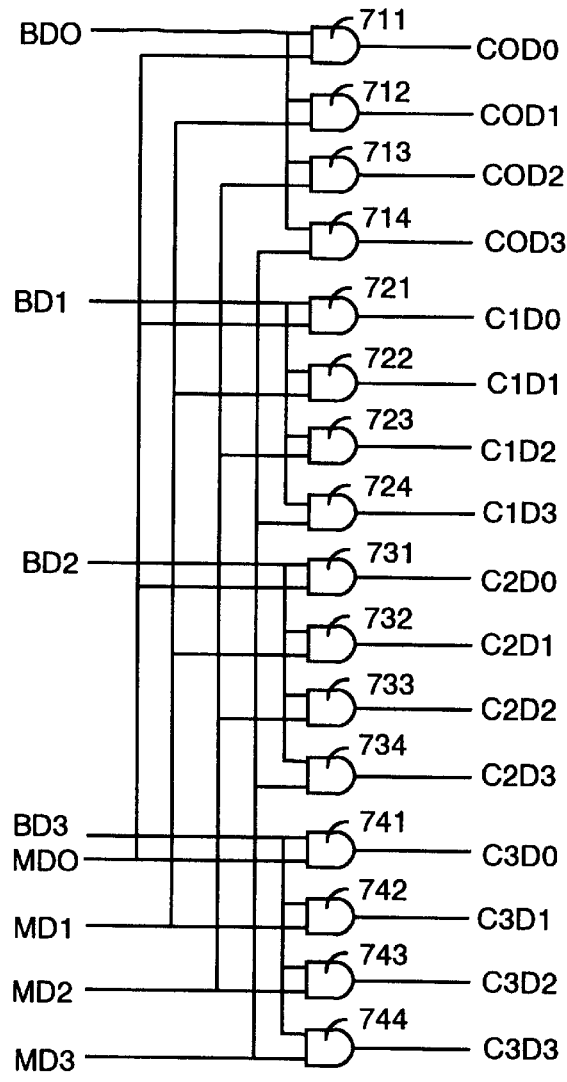
FIG. 4 shows an example of structure of a select logic 70 of the present invention.
Figure 5:
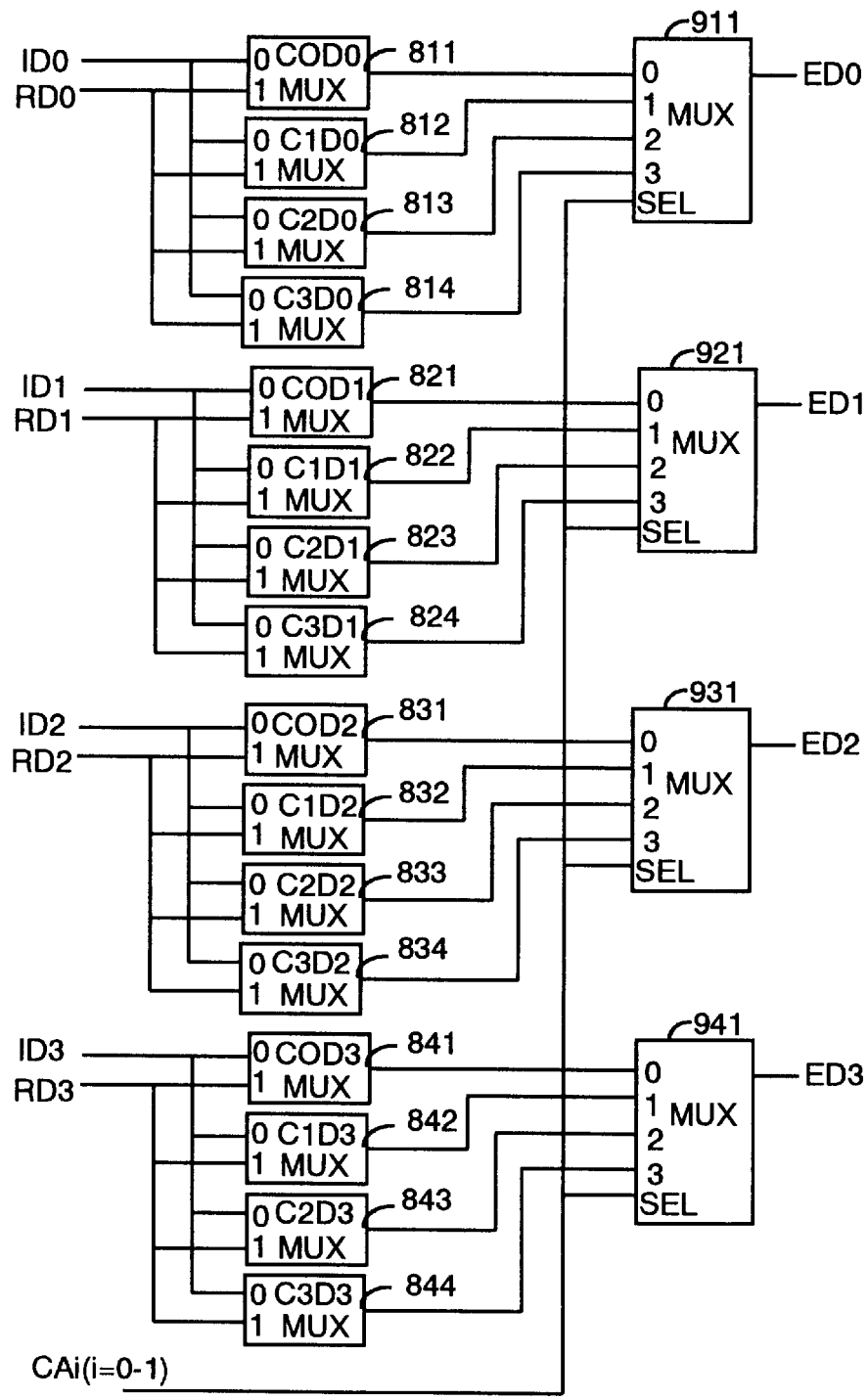
FIG. 5 shows an example of structure of a data multiplexer (80 and 90) of the present invention.
Figure 8:
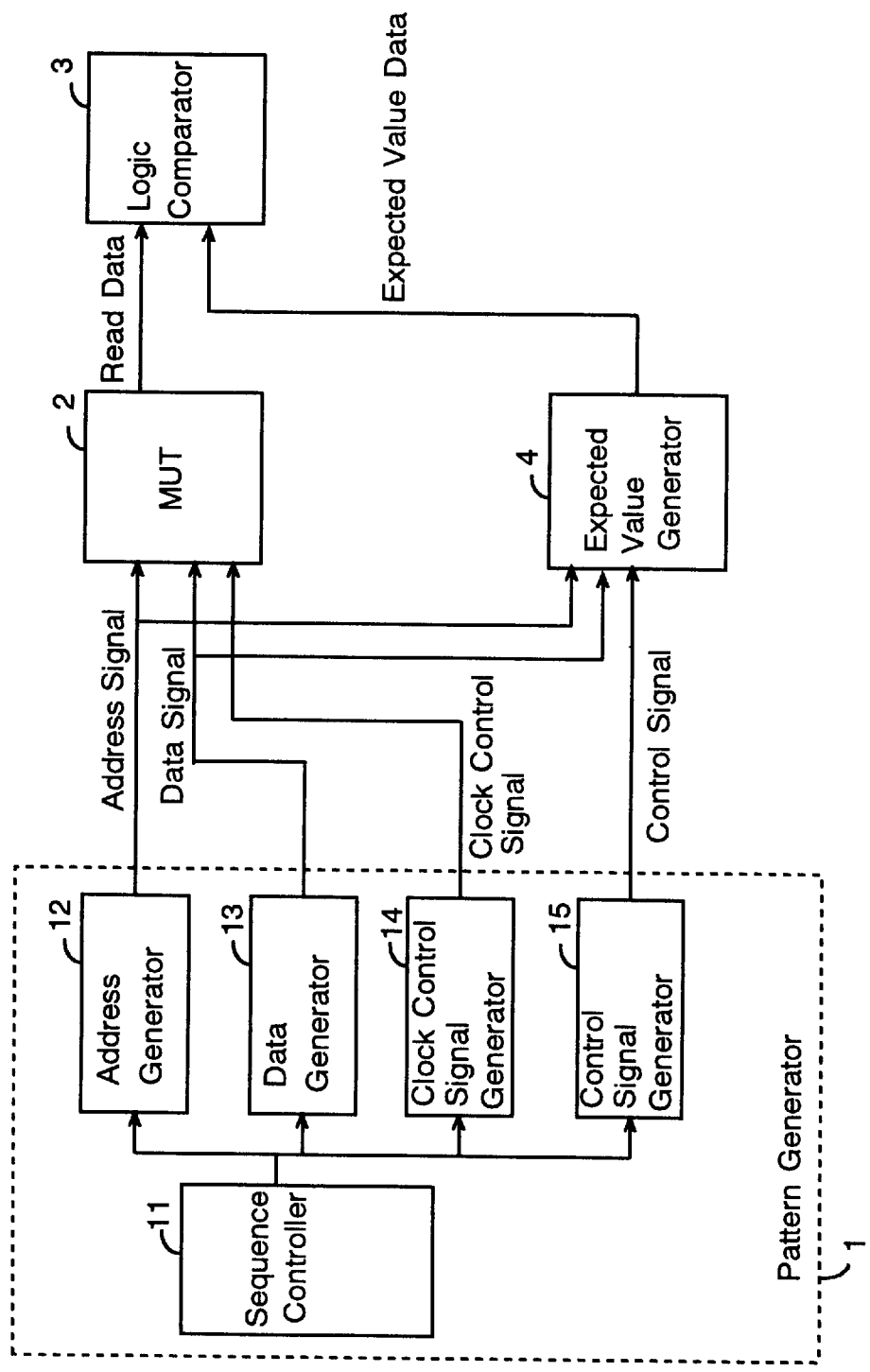
FIG. 8 shows an example of structure of a semiconductor test system for testing the quality of devices under test in the conventional technology.
Figure 9:
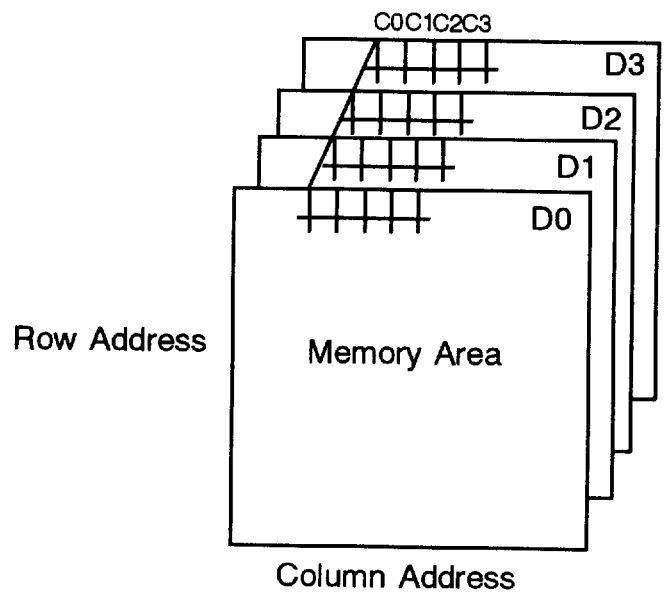
FIG. 9 is a schematic diagram showing the range of the memory area of the MUT which is accessed by one 4×4 block write operation.

FIG. 3 shows an example of structure of a 4×4 data formatter 60. FIG. 4 shows an example of structure of a select logic 70 in the data formatter 60. FIG. 5 shows an example of structure of a data multiplexer (80 and 90) in the data formatter 60.

FIG. 6 shows an example of memory cells corresponding to the 4×4 block write operation. Corresponding to the memory cells (4×4=16) shown in FIG. 6, sixteen multiplexers (811, 812 . . . 844), each of which is a 1-bit multiplexer, are provided as shown in FIG. 5. At a select-input of each of the multiplexers (811, 812 . . . 844), a corresponding logic gate shown in FIG. 4 is connected. Here, reference ID0–ID3 designate the input data signal, and reference RD0–RD3 designate the data register signal. The outputs of the sixteen multiplexers are connected to 4-1 multiplexers (911, 921, . . . 941) for each group of data bits D0–D3. The lower two bit signal (CA0, CA1) of the column address from the address selector 44 is supplied to each select-input, formed by two bits, of the multiplexers (911, 921, . . . 941). Thus, the sixteen bit data (4×4=16) is converted to expected value signals ED0–ED3 per four (4) bit by the lower 2 bit signal of the column address similar to test the four (4) bit read out data of the normal memory operation.

The operational procedure of the present invention is as follows. Prior to the test of the block write function of the MUT, information on column address bits which are undecided in the block write operation, i.e., the block structure, is specified in the address selector 44 in the expected value generator. Further, address bits are defined for switching the data of the data register 41 and the mask data register file 42. The definition of the address bits is performed based on the test specification of the MUT such as a specific kind of mask data used for a specific test corresponding to specified memory area to be tested. For instance, when the test is performed by the same test data for all of the memory area, all of the data switch signals are set to zero.

As a block write test of the MUT, first, data is written by a normal write procedure in the memory area of the MUT for which the block write function is to be tested to initialize the memory cells in the memory area. At this time, the expected value generator needs not to operate. When block write data is written in the data register inside the MUT, and the same data is also written in the data register 41 of the expected value generator.

Then, the mask data is written in the mask register inside the MUT and the same data is also written in the mask data register file 42 in the expected value generator. The address data for addressing the test area of the memory device for which the block write is performed by the mask data is generated by the address generator.

Then, the block write function of the MUT is carried out. In this situation, the expected value generator takes the data applied to the data pin of the MUT into the write data register file 43. The data acquisition for the write data register file 43 can be made by one execution of writing the data, rather than every block write cycle, for the test area of the memory device for which the block write is performed. In contrast, in the MUT, the block write function is repeatedly performed by required number of times.

In this manner, the block write function is performed for all the test area of the MUT by changing the data for the mask register and data register in the MUT. The data can be written in the write data register file 43 and the mask data register file 42 either before or after the block write function is performed for all the test area of the MUT.

When reading the data in the memory area in which the block write function is carried out, the multiplexer 50 is switched so as to select the expected value data from the expected value combining part 40. Then, as in an ordinary memory test, the read out data from the MUT is compared with the expected data by the logic comparator 3 to determine whether the MUT works correctly or not. This read process is performed by generating the data pattern again by the data generator 13 which was used, prior to the block write test, for initializing the memory area. The regenerated data pattern is considered as the data not renewed because of the masking and is used for producing the expected value data. Thus, the generation of the expected value data which will not contradict to the conditions of the memory cells of the MUT after the block write, is possible through the data formatter 60 in the expected value combining part by switching the RDn data and the Idn data for each one bit by the mask data of the mask data register file 42 and the write data register file 43.

As in the foregoing, according to the present invention, a large capacity memory is not required to generate the expected value data unlike the conventional system. As shown in FIG. 4, the select logic is comprised of one stage of AND gates, thereby allowing the high speed and low cost. Further, as shown in FIG. 5, the data multiplexer is comprised of simple logic circuits of the selector of 2 or 4 input terminals, thereby allowing the high speed and low cost. As consequence, the data formatter 60 is formed with high speed and low cost. As noted above, the other registers (41, 42, 43) and selector 44 and multiplexer 50 are also formed with high speed and low cost.

Industrial Applicability

Since it is configured as described in the foregoing, the present invention has the following effects.

The test pattern generator is achieved which is capable of testing the block write function of the memory device at high speed.

What is claimed is:

1. A test pattern generator (1) for generating expected value data to carry out logical comparison with an output of a device (2) under test characterized as having:

a data register (41) for taking in a data signal from a data generator (13) by a first write signal from a control signal generator (15);

an address selector (44) for selecting predetermined bits from an address signal generated by an address generator (12);

a mask data register file (42) for storing a data signal from said data generator (13) into an area specified by a data select signal output from said address selector (44) by a second write signal from said control signal generator (15);

a write data register file (43) for storing a data signal from said data generator (13) into an area specified by a data select signal output from said address selector (44) by a third write signal from said control signal generator (15);

A data formatter (60) which synthesizes and outputs the output data of said data register (41) or the output data of said data generator (13) based on the output signal of said address selector (44), the output signal of said mask data register file (42) and the output signal of said write data register file (43).

2. A test pattern generator of claim 1 characterized as having:

a multiplexer (50) that selects either the output signal of the data formatter (60) or the output signal of the data generator (13) based on the select signal from a control signal generator (15).

* * * * *